United States Patent
Mase

[19]

[11] Patent Number: 6,072,367

[45] Date of Patent: Jun. 6, 2000

[54] ELECTRONIC BALANCE ADJUSTING CIRCUIT

[75] Inventor: Katsuyoshi Mase, Tokyo, Japan

[73] Assignee: NEC Corporation, Tokyo, Japan

[21] Appl. No.: 09/208,847

[22] Filed: Dec. 10, 1998

[30] Foreign Application Priority Data

Dec. 10, 1997 [JP] Japan ..................................... 9-361941

[51] Int. Cl.[7] .............................. H03G 3/10; H03G 3/12; H03G 3/00; H03F 21/00

[52] U.S. Cl. .......................... 330/278; 330/282; 330/284; 381/107; 381/120

[58] Field of Search .................................... 330/278, 279, 330/282, 284; 381/10, 104, 107, 108, 120, 121

[56] References Cited

U.S. PATENT DOCUMENTS

| | | | |
|---|---|---|---|
| 4,794,343 | 12/1988 | Yang | 330/279 |
| 4,947,440 | 8/1990 | Bateman et al. | 381/107 |
| 5,187,619 | 2/1993 | Sidman | 330/284 |
| 5,410,280 | 4/1995 | Linguet et al. | 330/10 |
| 5,450,494 | 9/1995 | Okubo et al. | 381/108 |

FOREIGN PATENT DOCUMENTS 8-204771  8/1996  Japan .

*Primary Examiner*—Robert Pascal
*Assistant Examiner*—Patricia T. Nguyen
*Attorney, Agent, or Firm*—Foley & Lardner

[57] ABSTRACT

An electronic balance adjusting circuit comprises a register for holding a balance data and capable of changing the balance data held in the register, a first ALU receiving the balance data held in the register for outputting a first digital value corresponding to a first ratio, and a second ALU receiving the balance data held in the register for outputting a second digital value corresponding to a second ratio having such an inverse increase/decrease relation to the first ratio that when the first ratio increases, the second ratio decreases and when the first ratio decreases, the second ratio increases. A first digital-to-analog converter receives the first digital value to output a first analog signal indicative of the first ratio, and a second digital-to-analog converter receives the second digital value to output a second analog signal indicative of the second ratio. A first variable attenuator receives a first input signal and is controlled by the first analog signal to output a first output signal which has been attenuated by the attenuation amount in accordance with the first analog signal, and a second variable attenuator receives a second input signal and is controlled by the second analog signal to output a second output signal which has been attenuated by the attenuation amount in accordance with the second analog signal.

19 Claims, 2 Drawing Sheets

| INPUT DATA (VALUE OF REGISTER) | RATIO OF OUTPUT A | RATIO OF OUTPUT B |
|---|---|---|
| FFh | 0 | 1 |
| FEh | 0.003 | 0.997 |
| ... | ... | ... |
| 80h | 0.5 | 0.5 |
| ... | ... | ... |
| 00h | 1 | 0 |

ELECTRONIC BALANCE ADJUSTING CIRCUIT

BACKGROUND OF THE INVENTION

1. Field of the Invention

The present invention relates to a balance adjusting circuit for adjusting the balance between a left sound and a right sound in a stereophonic sound, and more specifically to an electronic balance adjusting circuit for electronically executing a balance adjustment.

2. Description of Related Art

Referring to FIG. 1, there is shown a circuit diagram of one example of the prior art balance adjusting circuit. The balance adjusting circuit is so configured to adjust the balance by determining respective amplification factors of a pair of operational amplifiers by variable resistors.

Specifically, as shown in FIG. 1, one of a pair of input signals A is supplied to an inverting input of an operational amplifier 9 having a non-inverting input connected to ground, and similarly, the other input signal B is supplied to an inverting input of another operational amplifier 10 having a non-inverting input connected to ground. An output of the operational amplifier 9 is fed back to the inverting input of the operational amplifier 9 through one resistor 11A of a variable double resistor 11, and similarly, an output of the operational amplifier 10 is fed back to the inverting input of the operational amplifier 10 through the other resistor 11B of the variable double resistor 11, so that respective gains of the operational amplifiers are controlled by adjusting the feedback amount by means of the variable resistor 11. The output of the operational amplifier 9 outputs one of a pair of output signals A, and the output of the operational amplifier 10 outputs the other output signal B.

The variable double resistor 11 is so constructed that the resistance of the variable resistor 11A and the resistance of the variable resistor 11B are simultaneously changed by an adjusting manual operation while maintaining such a relation that the resistance value of the variable resistor 11A is in inverse proportion to the resistance value of the variable resistor 11B. In this specification, the term "inverse proportion" does not mean a restrict meaning defined in mathematics, but is used to mean such a relation between two values that when one value increases, the other value decreases, and when the one value decreases, the other value increases.

When it is desired to adjust the balance in the prior art balance adjusting circuit shown in FIG. 1, the variable resistor 11 is manually operated so that the respective resistance values of the feedback variable resistor 11A and the feedback variable resistor 11B are caused to change simultaneously. Since the resistance values of the feedback variable resistor 11A and the feedback variable resistor 11B are in inverse proportion to each other, if the resistance value of one of the variable resistors increases, the resistance value of the other resistor decreases, with the result that the respective magnitudes of the output signals A and B simultaneously change in inverse proportion to each other, and therefore, the balance between the output signal A and the output signal B is adjusted.

However, the following problems have been encountered in the prior art balance adjusting circuit shown in FIG. 1.

A first problem is that an output error is large. The reason is that since the variable resistor is so constructed that the resistance value is changed by a physical contact, the obtained resistance value is instable because of friction, temperature change and deterioration.

A second problem is that a circuit scale is large. The reason is that it is physically difficult to scale down the variable resistor so constructed that the resistance value is changed by a physical contact, and the number of parts including the resistors and the operational amplifiers is large.

Here, Japanese Patent Application Pre-examination Publication No. JP-A-08-204771 (an English abstract of JP-A-08-204771 is available from the Japanese Patent Office and the content of the English abstract of JP-A-08-204771 is also incorporated by reference in its entirety into this application) discloses an IQ automatic adjustment circuit for automatically making the gain/offset of I and Q signals equal to the gain/offset of a reference signal in a digital quadrature modulation circuit. However, this circuit does not adjust the balance between the I signal and the Q signal, but makes each of the I signal and the Q signal equal to the reference signal.

SUMMARY OF THE INVENTION

Accordingly, it is an object of the present invention to provide a balance adjusting circuit which has overcome the above mentioned defect of the conventional one.

Another object of the present invention is to provide an electronic balance adjusting circuit which does not use a variable resistor and which has a reduce circuit scale.

The above and other objects of the present invention are achieved in accordance with the present invention by an electronic balance adjusting circuit comprising a register means for holding a balance data and capable of changing the balance data held in the register, a first computing means receiving the balance data held in the register for outputting a first digital value corresponding to a first ratio, a second computing means receiving the balance data held in the register for outputting a second digital value corresponding to a second ratio having such an inverse increase/decrease relation to the first ratio that when the first ratio increases, the second ratio decreases and when the first ratio decreases, the second ratio increases, a first digital-to-analog converting means receiving the first digital value for outputting a first analog signal indicative of the first ratio, and a second digital-to-analog converting means receiving the second digital value for outputting a second analog signal indicative of the second ratio.

Preferably, the electronic balance adjusting circuit further includes a first variable gain circuit receiving a first input signal and controlled by the first analog signal to output a first output signal which has been amplified or attenuated by the gain or the attenuation amount in accordance with the first analog signal, and a second variable gain circuit receiving a second input signal and controlled by the second analog signal to output a second output signal which has been amplified or attenuated by the gain or the attenuation amount in accordance with the second analog signal.

In an embodiment of the electronic balance adjusting circuit, the first computing means outputs, as the first digital value, a value obtained by subtracting the balance data held in the register means from an upper limit value which can be held in the register means, and the second computing means outputs the balance data held in the register means without modification as the second digital value.

Furthermore, the register means increases the balance data held in the register means in response to an increment signal, and decreases the balance data held in the register means in response to a decrement signal. The register means may be written with the balance data value. In a specific embodiment, when the balance data held in the register means is a half of the upper limit value which can be held in the register means, the first ratio is substantially equal to the second ratio. Furthermore, the first ratio and the second ratio have such a relation that $0 \leq A \leq 1$ and $A+B=1$ where A is the first ratio and B is the second ratio.

The electronic balance adjusting circuit in accordance with the present invention having the above mentioned arrangement can control the output ratio (balance) between respective output voltages of two different channels by writing one digital data into the register means or by incrementing or decrementing the value of the register means by means of the increment signal or the decrement signal.

If the balance data is written into the register, the balance data is transferred to the first computing means and the second computing means provided for the two different channels, respectively. In each of the respective computing means, the balance data is converted into a digital data indicative of a ratio necessary for realizing the balance between the respective outputs of the two different channels. Two items of digital data are supplied to the first and second digital-to-analog converting means, respectively, each of which converts the received digital data into an analog voltage so as to output the analog signal having the magnitude in proportion to the magnitude allocated to the corresponding channel in order to establish the balance between the output voltages of the two channels. Thus, the output voltages of the two channels are balance-controlled by writing the digital data into only one register means.

The above and other objects, features and advantages of the present invention will be apparent from the following description of preferred embodiments of the invention with reference to the accompanying drawings.

DESCRIPTION OF THE PREFERRED EMBODIMENTS

Figure 1:
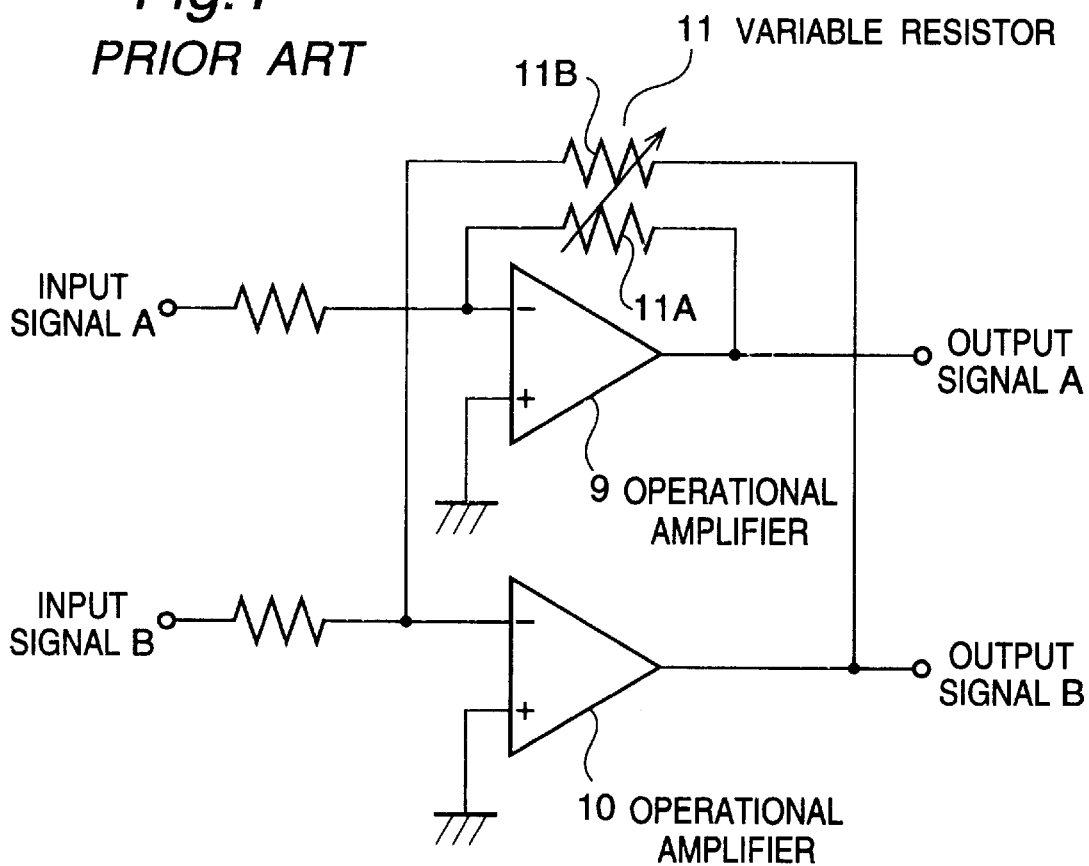
FIG. 1 is a circuit diagram of one example of the prior art balance adjusting circuit.
Figure 2:
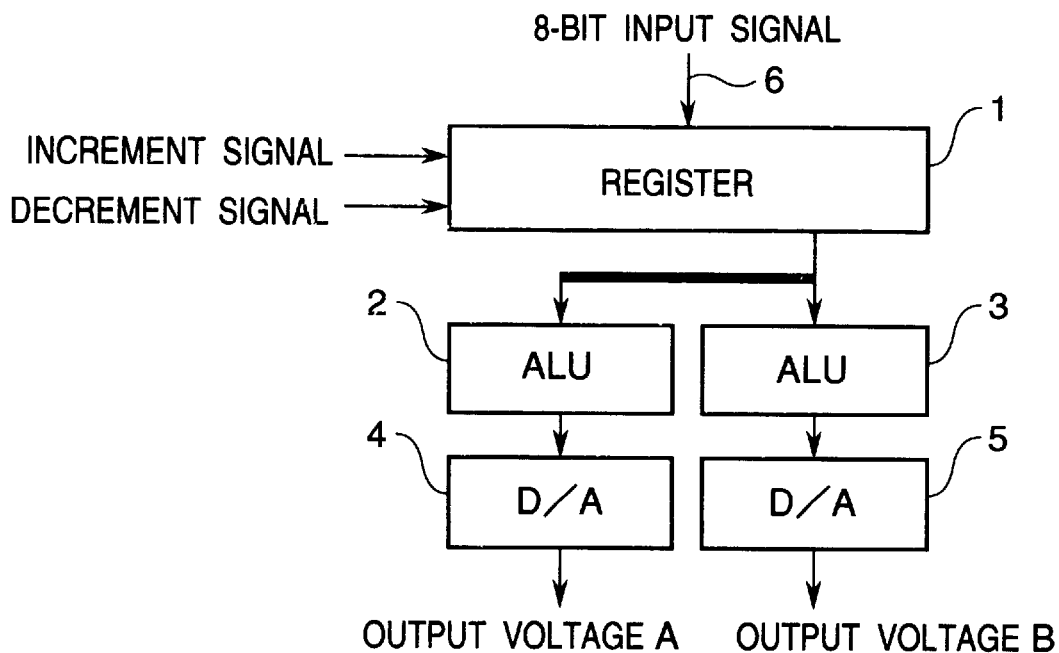
FIG. 2 is a block diagram of a first embodiment of the electronic balance adjusting circuit in accordance with the present invention.

Referring to FIG. 2, there is shown a block diagram of a first embodiment of the electronic balance adjusting circuit in accordance with the present invention.

The shown electronic balance adjusting circuit includes a 8-bit register 1 for holding a balance data of 8 bits. Data can be freely written and rewritten into the register 1 by a 8-bit input signal 6, and a content of the register 1 can be increased by "1" by each one increment signal and can also be decremented by "1" by each one decrement signal.

The content of the register 1 is supplied to an ALU (arithmetic and logic unit) 2 for an output A and an ALU 3 for an output B. In accordance with a conversion table which will be described hereinafter, each of the ALUs 2 and 3 converts the 8-bit data in the register 1 into an individual output ratio which defines the ratio between the output A and the output B. The ALUs 2 and 3 output data of 8 bits indicative of the output ratio thus obtained, to D/A (digital-to-analog) converters 4 and 5, respectively. Each of the D/A converters 4 and 5 converts the received digital data into an analog voltage, so that the D/A converters 4 and 5 output an output voltage A and an output voltage B, respectively.

Here, assuming that an upper limit value of the register 1 is "FFh" where the suffix "h" means a hexadecimal notation, an initial value of the register 1 is set to "80h" so that when the circuit is put in an operating condition, the output voltage A and the output voltage B equal to each other are outputted. The relation between the output ratio and the data held in the register 1 is shown in FIG. 3.

Figures 3, 4:
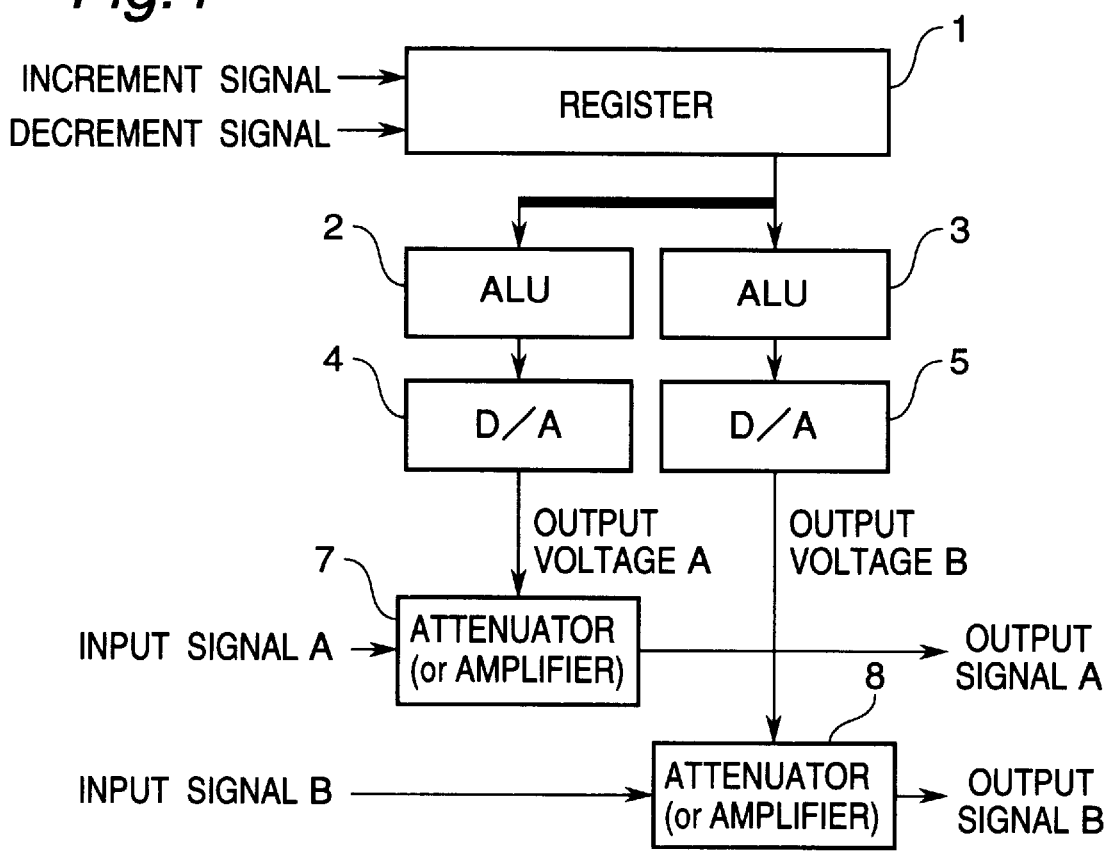
FIG. 3 is a table illustrating an example of a converting processing executed in two ALUs in the electronic balance adjusting circuit shown in FIG. 2.
FIG. 4 is a block diagram of a second embodiment of the electronic balance adjusting circuit in accordance with the present invention.

As shown in FIG. 3, in the case of the 8-bit digital data, the ratio between the output voltage A and the output voltage B can be changed in 256 steps, and each of the D/A converters 4 and 5 converts the 8-bit digital data in an analog voltage which changes in 256 steps in the range from 0V to a power supply voltage. Similarly to a second embodiment described hereinafter, the output voltage A and the output voltage B can be outputted as a control voltage signal supplied to voltage controlled variable attenuators each of which attenuates an actually inputted signal in accordance with the magnitude of the control voltage.

Now, an operation of the electronic balance adjusting circuit shown in FIG. 2 will be described. If the balance data is written into the register 1 by the 8-bit input signal 6 or if the content of the register 1 is modified by the increment signal or the decrement signal, the data of the register 1 is supplied to the ALU 2 for the output A and the ALU 3 for the output 3.

Here, it is assumed that the balance data written and held in the register 1 defines the output ratio of the respective outputs as shown in FIG. 3. The output ratio has 256 steps in such a relation that when the balance data is "80h", the ratio of the output voltage A is "0.5" and the ratio of the output voltage B is "0.5"; when the balance data is "00h", the ratio of the output voltage A is "1" and the ratio of the output voltage B is "0"; and when the balance data is "FFh", the ratio of the output voltage A is "0" and the ratio of the output voltage B is "1".

The ALUs 2 and 3 receiving the 8-bit digital data from the register 1, execute an arithmetic operation to output the output ratio as shown in FIG. 3. In this embodiment, the arithmetic operation is that the ALU 2 subtracts the value of the register 1 from "FFh", and the ALU 3 outputs the value of the register 1 without modification.

The individual output ratio for the output A and the individual output ratio for the output B, thus obtained by the ALUs 2 and 3, are simultaneously transferred to the D/A converters 4 and 5, respectively, which convert the received digital data into the analog output voltage A and the analog output voltage B, respectively. Thus, the ratio between the analog output voltage A and the analog output voltage B corresponds to the balance data held in the register 1.

Referring to FIG. 4, there is shown a block diagram of a second embodiment of the electronic balance adjusting circuit in accordance with the present invention. In FIG. 4, elements corresponding to those shown in FIG. 2 are given the same Reference Numerals, and explanation thereof will be omitted for simplification of the description.

In the second embodiment of the electronic balance adjusting circuit shown in FIG. 4, the content of the register 1 is not set with the 8-bit input signal 6, but is set and adjusted by only two serial signals, which are the increment signal and the decrement signal.

The first embodiment shown in FIG. 2 is so configured to output the output voltages A and B respectively indicating the individual output ratios of a pair of output signals a balance between which should be adjusted. In this second embodiment, however, the output voltages of the D/A converters 4 and 5 are supplied, as a control voltage signal, to attenuation amount variable attenuators 7 and 8, respectively. The voltage controlled variable attenuator 7 receives an input signal A (for example, a left channel sound signal in a pair of stereophonic channels) and outputs an output signal A which is attenuated in accordance with the output voltage of the D/A converter 4. The voltage controlled variable attenuator 8 receives an input signal B (for example, a right channel sound signal in a pair of stereophonic channels) and outputs an output signal B which is attenuated in accordance with the output voltage of the D/A converter 5. Accordingly, the balance between the input signal A and the input signal B is adjusted by the attenuators 7 and 8, and the balance-adjusted signals are outputted as the output signal A and the output signal B. Thus, for example, a left sound signal and a right sound signal in a stereophonic sound are balance-adjusted.

An operation of the electronic balance adjusting circuit shown in FIG. 4 will be described. The value of the register 1 modified by the serial input signal (the increment signal or the decrement signal) is supplied to the ALU 2 for the output A and the ALU 3 for the output 3. Respective outputs of the ALUs 2 and 3 are supplied to the D/A converters 4 and 5, respectively, which convert the respective received digital data into the analog output voltages A and B, which are supplied to the attenuators 7 and 8 as the attenuation control signals, respectively. Accordingly, the respective attenuation amounts of the attenuators 7 and 8 are adjusted by changing the attenuation control signals, namely, the analog output voltages A and B, with the result that the input signals A and B are attenuated by different attenuation amounts, respectively, so that the balance-adjusted output signals A and B are outputted.

In this embodiment, a pair of variable gain amplifiers can be used in place of the attenuators 7 and 8 so that respective gains of the variable gain amplifiers are controlled by the analog output voltages A and B of the D/A converters 4 and 5, respectively.

As mentioned above, the electronic balance adjusting circuit in accordance with the present invention has the following advantages:

A first advantage is that the balance adjusting circuit has been simplified, because two analog output voltages or signals for two different channels can be balance-adjusted by one digital data without computing a balance by an external processing means.

A second advantage is that the current output ratio and the output voltage can be known, because the value of the register is reflected to the output voltage by means of the D/A converters and therefore the value of the register is indicative of the current output ratio and the output voltage.

A third advantage is that the two analog outputs can be balance-adjusted by one operation, because the value of the register can be changed by any of the increment signal, the decrement signal and the 8-bit input signal.

The invention has thus been shown and described with reference to the specific embodiments. However, it should be noted that the present invention is in no way limited to the details of the illustrated structures but changes and modifications may be made within the scope of the appended claims.

What is claimed is:

1. An electronic balance adjusting circuit comprising a register means for holding a balance data and capable of changing said balance data held in said register, a first computing means receiving said balance data held in said register for outputting a first digital value corresponding to a first ratio, a second computing means receiving said balance data held in said register for outputting a second digital value corresponding to a second ratio having such an inverse increase/decrease relation to said first ratio that when said first ratio increases, said second ratio decreases and when said first ratio decreases, said second ratio increases, a first digital-to-analog converting means receiving said first digital value for outputting a first analog signal indicative of said first ratio, and a second digital-to-analog converting means receiving said second digital value for outputting a second analog signal indicative of said second ratio.

2. An electronic balance adjusting circuit claimed in claim 1 further including a first variable gain circuit receiving a first input signal and controlled by said first analog signal to output a first output signal which has been amplified or attenuated by the gain or the attenuation amount in accordance with said first analog signal, and a second variable gain circuit receiving a second input signal and controlled by said second analog signal to output a second output signal which has been amplified or attenuated by the gain or the attenuation amount in accordance with said second analog signal.

3. An electronic balance adjusting circuit claimed in claim 2 wherein said first computing means outputs, as said first digital value, a value obtained by subtracting said balance data held in said register means from an upper limit value which can be held in said register means, and said second computing means outputs said balance data held in said register means without modification as said second digital value.

4. An electronic balance adjusting circuit claimed in claim 3 wherein said register means increases said balance data held in said register means in response to an increment signal, and decreases said balance data held in said register means in response to a decrement signal.

5. An electronic balance adjusting circuit claimed in claim 4 wherein said register means cart be written with said balance data value.

6. An electronic balance adjusting circuit claimed in claim 5 wherein when said balance data held in said register means is a half of said upper limit value which can be held in said register means, said first ratio is substantially equal to said second ratio.

7. An electronic balance adjusting circuit claimed in claim 6 wherein said first ratio and said second ratio have such a relation that $0 \leq A \leq 1$ and $A+B=1$ where A is said first ratio and B is said second ratio.

8. An electronic balance adjusting circuit claimed in claim 1 wherein said first computing means outputs, as said first digital value, a value obtained by subtracting said balance data held in said register means from an upper limit value which can be held in said register means, and said second computing means outputs said balance data held in said register means without modification as said second digital value.

9. An electronic balance adjusting circuit claimed in claim 8 wherein said register means increases said balance data held in said register means in response to an increment signal, and decreases said balance data held in said register means in response to a decrement signal.

10. An electronic balance adjusting circuit claimed in claim 9 wherein said register means can be written with said balance data value.

11. An electronic balance adjusting circuit claimed in claim 10 wherein when said balance data held in said register means is a half of said upper limit value which can be held in said register means, said first ratio is substantially equal to said second ratio.

12. An electronic balance adjusting circuit claimed in claim 11 wherein said first ratio and said second ratio have such a relation that $0 \leqq A > 1$ and $A+B=1$ where A is said first ratio and B is said second ratio.

13. An electronic balance adjusting circuit claimed in claim 1 wherein said register mean s increases said balance data held in said register means in response to an increment signal, and decreases said balance data held in said register means in response to a decrement signal.

14. An electronic balance adjusting circuit claimed in claim 13 wherein said register means can be written with said balance data value.

15. An electronic balance adjusting circuit claimed in claim 14 wherein when said balance data held in said register means is a half of said upper limit value which can be held in said register means, said first ratio is substantially equal to said second ratio.

16. An electronic balance adjusting circuit claimed in claim 15 wherein said first ratio and said second ratio have such a relation that $0 \leqq A \leqq 1$ and $A+B=1$ where A is said first ratio and B is said second ratio.

17. An electronic balance adjusting circuit claimed in claim 1 wherein when said balance data held in said register means is a half of said upper limit value which can be held in said register means, said first ratio is substantially equal to said second ratio.

18. An electronic balance adjusting circuit claimed in claim 17 wherein said first ratio and said second ratio have such a relation that $0 \leqq A \leqq 1$ and $A+B=1$ where A is said first ratio and B is said second ratio.

19. An electronic balance adjusting circuit claimed in claim 1 wherein said first ratio and said second ratio have such a relation that $0 \leqq A \leqq 1$ and $A+B=1$ where A is said first ratio and B is said second ratio.

* * * * *